(12) United States Patent
Franceschini et al.

(10) Patent No.: US 8,352,839 B2
(45) Date of Patent: Jan. 8, 2013

(54) ENCODING DATA INTO CONSTRAINED MEMORY

(75) Inventors: Michele M. Franceschini, White Plains, NY (US); Ashish Jagmohan, White Plains, NY (US); Luis A. Lastras-Montano, Cortlandt Manor, NY (US); Mayank Sharma, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 385 days.

(21) Appl. No.: 12/814,142

(22) Filed: Jun. 11, 2010

(65) Prior Publication Data

US 2011/0307670 A1    Dec. 15, 2011

(51) Int. Cl.
    *H03M 13/00*    (2006.01)
(52) U.S. Cl. ........................ 714/779; 714/767
(58) Field of Classification Search ........... 365/189.011; 711/103; 714/773, 769, 772, 779, 767
See application file for complete search history.

(56) References Cited

U.S. PATENT DOCUMENTS

| | | |
|---|---|---|
| 4,168,486 A | 9/1979 | Legory |
| 5,377,148 A | 12/1994 | Rajsuman |
| 5,684,809 A | 11/1997 | Stave et al. |
| 6,002,623 A | 12/1999 | Stave et al. |
| 6,347,386 B1 | 2/2002 | Beffa |
| 7,069,484 B2 | 6/2006 | Beffa |
| 7,069,494 B2 | 6/2006 | Cargnoni et al. |
| 7,219,276 B2 | 5/2007 | Mantri |
| 7,353,438 B2 | 4/2008 | Leung et al. |
| 8,176,234 B2 * | 5/2012 | Franceschini et al. ........ 711/103 |
| 2010/0277989 A1 * | 11/2010 | Elfadel et al. .......... 365/189.011 |
| 2011/0246703 A1 * | 10/2011 | Franceschini et al. ........ 711/103 |

FOREIGN PATENT DOCUMENTS

| | | |
|---|---|---|
| EP | 0978125 B1 | 2/2002 |
| EP | 2031492 A1 | 3/2009 |

OTHER PUBLICATIONS

C. Heegard et al.; "On the Capacity of Computer Memory with Defects"; IEEE Transactions on Information Theory, vol. IT-29, No. 5; Sep. 1983.

* cited by examiner

*Primary Examiner* — David Ton
(74) *Attorney, Agent, or Firm* — Cantor Colburn LLP; Brian Verminski

(57) ABSTRACT

Encoding data into constrained memory using a method for writing data that includes receiving write data to be encoded into a write word, receiving constraints on symbol values associated with the write word, encoding the write data into the write word, and writing the write word to a memory. The encoding includes: representing the write data and the constraints as a first linear system in a first field of a first size; embedding the first linear system into a second linear system in a second field of a second size, the second size larger than the first size; solving the second linear system in the second field resulting in a solution; and collapsing the solution into the first field resulting in the write word, the write word satisfying the constraints on symbol values associated with the write word.

25 Claims, 5 Drawing Sheets

ENCODING DATA INTO CONSTRAINED MEMORY

BACKGROUND

This invention relates generally to computer memory, and more specifically to encoding data into a constrained memory.

Phase change memory (PCM) cells exist in one of two states: amorphous which is associated with a low electrical conductivity state, and crystalline which is associated with a high electrical conductivity state. Sometimes a PCM cell is unable to switch from one state to another, hence becoming stuck or having a constrained value that cannot be changed. The inability to switch from one state to another can make a memory cell unusable. More sophisticated uses of PCM cells store multiple bits per cell by writing multiple analog levels. PCM cells exhibit variations on what resistance ranges they can achieve. These different ranges imply that the number of bits per cell that each cell can support can vary. One way of dealing with the different resistance ranges is to store a number of bits very close to the average of the individual bits per cell, even when the decoder does not know the ranges of the memory cells. This technique may further employ stuck bit codes based on the Luby transform (LT). A drawback of using the LT is that it can be difficult to implement in hardware.

Accordingly, and while existing techniques for dealing with constrained value memory cells may be suitable for their intended purpose, there remains a need in the art for memory systems that overcome these drawbacks.

SUMMARY

An embodiment is a method for writing data that includes receiving write data to be encoded into a write word, receiving constraints on symbol values associated with the write word, encoding the write data into the write word, and writing the write word to a memory. The encoding includes: representing the write data and the constraints as a first linear system in a first field of a first size; embedding the first linear system into a second linear system in a second field of a second size, the second size larger than the first size; solving the second linear system in the second field resulting in a solution; and collapsing the solution into the first field resulting in the write word, the write word satisfying the constraints on symbol values associated with the write word.

Another embodiment is a memory system that includes a memory including memory cells and constraints on symbol values stored in the memory cells, and an encoder in communication with the memory. The encoder is configured for receiving write data to be encoded into a write word that satisfies the constraints on the symbol values, encoding the write data into the write word, the encoding comprising, and transmitting the write word to the memory. The encoding includes: representing the write data and the constraints as a first linear system in a first field of a first size; embedding the first linear system into a second linear system in a second field of a second size, the second size larger than the first size; solving the second linear system in the second field resulting in a solution; and collapsing the solution into the first field resulting in the write word, the write word satisfying the constraints on symbol values in the write word.

Another embodiment is a computer implemented method for transmitting data that includes receiving data to be encoded into a word for transmission across a transmission medium, receiving constraints on symbol values associated with the word, encoding the data into the word, and outputting the word on the transmission medium. The encoding includes: representing the data and the constraints as a first linear system in a first field of a first size; embedding the first linear system into a second linear system in a second field of a second size, the second size larger than the first size; solving the second linear system in the second field resulting in a solution; and collapsing the solution into the first field resulting in the word, the word satisfying the constraints on symbol values associated with the word.

A further embodiment is a computer implemented method for solving linear systems including receiving a linear system of equations in a first field of a first size, embedding the linear system of equations into a second field of a second size, the second size larger than the first size, solving the linear system of equations in the second field resulting in a second field solution, collapsing the second field solution into the first field resulting in a first field solution, and outputting the first field solution.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

An embodiment of the present invention is a method for encoding data in memories with memory cells having constrained values (e.g., "stuck cells"). Algorithms for performing the encoding rely on earlier code constructions termed cyclic partitioned linear block codes (PLBCs). For the corresponding q-ary Bose Chaudhuri Hocquenghem (BCH) type codes for u constrained values in a codeword of length n, an embodiment of the encoding algorithm has complexity $O((u \log_q n)^2)$ $F_q$ operations, which compares favorably to a generic approach based on Gaussian elimination. It is noted that a codeword is regarded as a sequence of symbols. The computational complexity improvements are realized by taking advantage of the algebraic structure of cyclic codes for codeword symbols having constrained symbol values. The algorithms are also applicable to cyclic codes for both encoding with constrained symbol values and decoding with received words with errors.

In addition to its meaning as an entry in a codeword, as used herein, the term "symbol" refers to data stored in one or more memory cells. In an embodiment, one memory cell may include two symbols, one symbol may span two memory cells, and/or one memory cell may include one symbol. More generally, one memory cell may include a plurality of symbols or one symbol may span a plurality of cells. When used to describe a communication system, one wire (e.g., on a bus or other transmission medium) may carry two symbols, two wires may combine to carry one symbol, and/or one wire may carry one symbol. More generally, one wire may include a plurality of symbols or one symbol may span a plurality of cells. In addition, a symbol is regarded as an element of a Galois field.

As used herein, the term "constrained symbol value" generally refers to a constraint to be enforced in some positions of a word. For example, a memory may have positions that are stuck to one value and the data is to be stored in a manner that conforms to the stuck values. Or it may be advantageous to store a particular value in a particular position of a memory in order to save power or increase reliability of the stored word. Alternately, a memory cell may have a constraint on the range of reachable values and a word must be found to be written in which the level assigned to each cell fits inside of its variable range; this can be solved by solving one or more instances of encoding with codewords having constrained values. In a different application, data is sent through a link in which one of the wires is stuck to a value, and hence the data needs to be encoded for transmission satisfying a suitable constraint on the values of specific positions of the encoded data. Or alternately, one may find it convenient to fix a value of the transmission pattern so as to achieve improved power or reliability. A value may be one bit or multiple bits.

Figure 1:
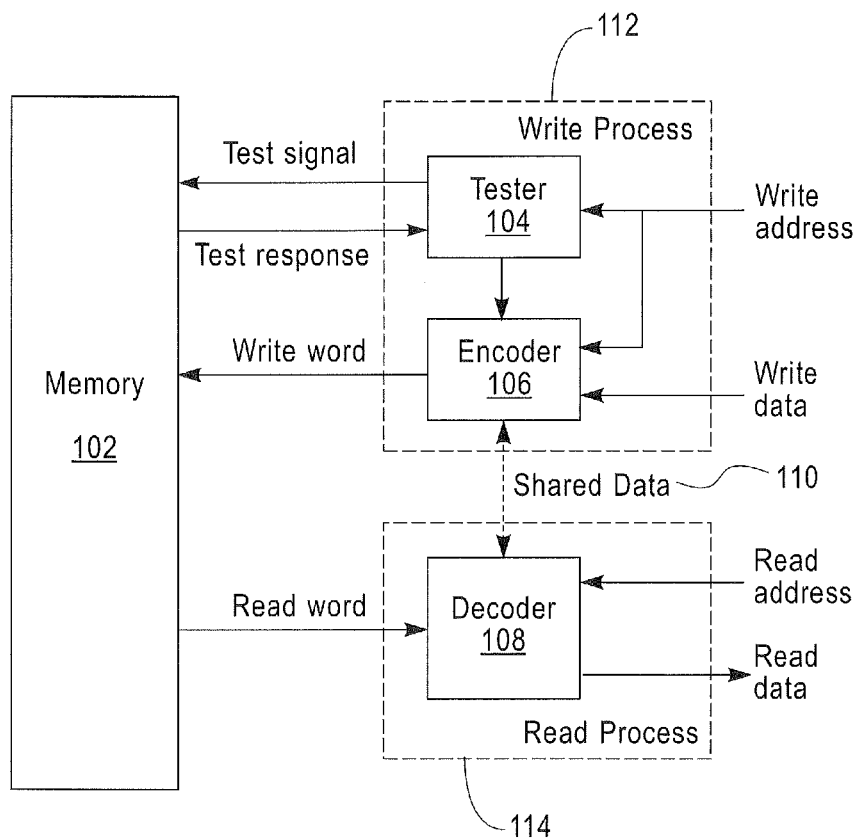
FIG. 1 illustrates a block diagram of a system for storing data in memory in accordance with an embodiment.

FIG. 1 illustrates a block diagram of a system for storing data in a memory in accordance with an embodiment. The system depicted in FIG. 1 includes memory 102 made up of blocks of memory cells, a tester 104 (e.g., for determining physical characteristics of the memory cells), an encoder 106 for receiving write data and generating a write word for storage in the memory cells, and a decoder 108 for receiving a read word from the memory 102 and generating read data. An embodiment of the write process 112 utilizes the tester 104, the encoder 106, and the shared codes 110 to generate the write word to be written to cells in the memory 102. Another embodiment of the system does not include the tester 104 and the write process 112 utilizes the encoder 106 and the shared codes 110 to generate the write word to be written to cells in the memory 102. An exemplary read process 114 utilizes the decoder 108 and the shared codes 110 to translate the read word from the memory 102 into the read data.

In an embodiment, the memory 102 is modeled as a medium that can store a vector of length n with elements in a finite field $F_q$ in n physical entities referred to herein as "memory cells". Occasionally, a memory cell may be constrained to a value and the write word written to the memory 102 must conform to the constrained values that the memory cells have. It is further assumed that the information of the identity and content of constrained value memory cells is known only at encoding time. Typically, this information is obtained by a cell state sensing procedure (e.g., performed by the tester 104) that could be time consuming. Learning the constrained cell information during the read process 114 increases the latency during a read and may involve the destruction of the written contents due to the sensing procedure. Both of these things are undesirable, hence justifying the importance of the assumption that the identity and content of constrained value memory cells is known only at encoding time.

Problem definition. Let $F_q$ denote the finite field with q elements, where q is a power of a prime. A message $m \in F_q^k$ is to be encoded and written into n memory cells, each of which can hold a value in $F_q$. Some of the memory cells are "stuck" or have a "constrained value" in that they hold a value that cannot be changed. It is assumed that there are u constrained cells; the indices of these cells are given by $\Psi = \{\psi_0, \ldots, \psi_{u-1}\}$ ($\psi_i \in \{0, 1, \ldots, n-1\}$) and the values to which they are constrained are given by $\Phi = \{\phi_1, \ldots, \phi_{u-1}\}$ ($\phi_i \in F_q$). The location and constrained value of the constrained cells are known only during the write process 112.

In an embodiment, the encoder 106 performs a mapping that accepts m, $\Psi$, $\Phi$ and returns $x \in F_q^n$, a vector to be written to memory that satisfies:

$$x_{\psi_i} = \phi_i, i \in \{0, 1, \ldots, u-1\} \quad (1)$$

In an embodiment, the decoder 108 performs a mapping that accepts x and recovers m. In another embodiment, the decoder 108 also has the ability to correct for errors in the standard sense of error correction for memories. Although most of the description herein is focused on the problem of encoding for constrained values, the embodiments are easily extendable to the problem of encoding for error bits.

An embodiment uses linear codes including a matrix $H_M$ with dimensions k×n and with entries in $F_q$. This matrix is referred to herein as "the message retrieval matrix"; as m is obtained from x through the operation $$m = H_M x \quad (2)$$

The encoding problem then is to find x satisfying equation (2) with the condition that equation (1) is satisfied. In an embodiment it is assumed that $H_M$ has full column rank, as otherwise there would instances of the encoding problem that cannot be solved for. In an embodiment, the adjustment code is defined as the linear space:

$$C_A = \{y \in F_q^n : H_M y = 0\}. \quad (3)$$

The encoding is then decomposed into two steps: Step One—find a vector x' such that $H_M x' = m$; and Step Two—find a vector $d \in C_A$ such that x=x'+d satisfies equation (1). Because the matrix $H_M$ is known at code design time, implementing Step One requires about $O(k^2)$ $F_q$ multiplication and addition operations; as a matter of fact the Galois field multiplications involved have one of the operands constant, significantly reducing their implementation complexity.

Let G be a n×n−k generator matrix for $C_A$. Step Two will always succeed if any choice of u rows of G is linearly independent. From this viewpoint, solving Step Two is equivalent to finding a vector $\xi \in F_q^{n-k}$ such that:

$$(d \triangleq G\xi)_{\psi_i} = \phi_i - (x')_{\psi_i} \triangleq s_i, i \in \{0, \ldots, u-1\} \quad (4)$$

It will be appreciated that this is not the only type of encoding method. In another embodiment, equation (2) is solved as a system of linear equations where the free variables are those memory cells that are not stuck. The problem size in this embodiment is related to the number of free variables, in turn related to the number of message bits. In contrast in the embodiment where decomposition into two steps is utilized, the problem size is related to the number of stuck symbols. Thus, the embodiments described herein provide the most benefit when there are fewer stuck bits than message bits. This is an important case because it most compatible with mid to high coding rate applications commonly encountered in applications.

Preliminaries. Extension fields from finite field theory are relied on herein to describe the cyclic codes for stuck bits. For some integer $\mu \geq 1$, the degree-$\mu$ extension of $F_q$ is denoted by $F_{q^\mu}$. In this embodiment, elements of $F_{q^\mu}$ are viewed as $\mu$-column vectors whose entries are elements of $F_q$. If $a \in F_{q^\mu}$, then the ith element of the column vector associated with a will be denoted by $(a)_i$; thus for example we write $a=[(a)_0 \ldots (a)_{m\mu-1}]^T$, where T denotes the transpose operator. Let $p(\bullet)$ be a polynomial of degree $\mu$ with coefficients in $F_q$ that is irreducible over $F_q$, i.e. $p(\bullet)$ cannot be stated as a product of two or more polynomials with coefficients in $F_q$. Let $\eta \in F_{q^\mu}$ denote a root of the equation $p(\eta)=0$. To an element $a \in F_{q^\mu}$ associate the univariate polynomial $\Sigma_{i=0}^{\mu-1}(a)_i \eta^i$. Multiplication and addition of elements of $F_{q^\mu}$ is then achieved by the usual rules for polynomial arithmetic followed by a modulus operation that accounts for $p(\eta)=0$.

The dot product between two elements $a,b \in F_{q^\mu}$ is defined as $$\langle a, b \rangle = \sum_{i=0}^{\mu-1} (a)_i (b)_i \in F_q.$$

Let $\xi \in F_{q^\mu}$. The companion to $\xi$ us defines as the $F_{q^\mu}$ element:

$$[(\xi)_0 (\xi\eta)_0 \ldots (\xi\eta^{\mu-1})_0]^T$$

From this definition, it can be easily deduced that if a,b are the companions to $\alpha,\beta$ then a+b is the companion to a $\alpha+\beta$, and $\zeta \in F_q$ then $\zeta a$ is the companion of $\zeta\alpha$. As a consequence, the operator that returns the companion of an element must be linear and thus there exists a $\mu\times\mu$ matrix with elements in $F_q$, which is referred to as $\Lambda$, such that the result of the matrix×vector operation $\Lambda\xi$ results on the companion of $\xi$ for any $\xi \in F_{q^\mu}$. The following basic result will be useful in later usage of the $\Lambda$ linear operator as described herein.

Lemma A. For any $a,b \in F_{q^\mu}$, $\langle a, \Lambda b \rangle = (ab)_0$.

Proof of Lemma A. Write $a=(a)_0+(a)_1\eta+\ldots+(a)_{\mu-1}\eta^{\mu-1}$, so that $ab=(a)_0 b+(a)_1 b\eta+\ldots+(a)_{\mu-1}b\eta^{\mu-1}$ and therefore:

$$(ab)_0 = (a)_0(b)_0 + (a)_1(b\eta)_0 + \ldots + (a)_{\mu-1}(b\eta^{\mu-1})_0$$

$$= \langle a, \Lambda b \rangle.$$

Similarly, let $a,b \in F_{q^\mu}$. It is known that $(a+b)^q = a^q + b^q$, that is, raising to the qth power is a linear operation. Let S denote the $\mu\times\mu$ matrix with elements in $F_{q^\mu}$ such that $\xi^q = S\xi$ for every $\xi \in F_{q^\mu}$.

The following discussion assumes familiarity with basic concepts of the theory of linear and cyclic codes such as duality and generator/check polynomials. In an embodiment described herein, it is assumed that n is a factor of the integer $q^\mu-1$. Let $\omega \in$ field be such that $\omega^n=1$ and there is no positive integer $j<n$ with the same property; such an element is known to exist. The Fourier transform V of a vector $v \in F_{q^\mu}^n$ is defined as $$V_i = \sum_{j=0}^{n-1} v_j \omega^{ij} i \in \{0, \ldots, n-1\}.$$

The inverse Fourier transform of a vector $V \in F_{q^\mu}^n$ is given by $$v_i = \frac{1}{n} \sum_{j=0}^{n-1} V_j \omega^{-ij} i \in \{0, \ldots, n-1\}$$

where $n=1+1+\ldots+1$ (n times). It is known that any vector $v \in F_q^n$ has a Fourier transform, V, that satisfies the q-ary conjugacy constraint:

$$V_j^q = V_{jq \bmod n} \quad 0 \leq j < n. \qquad (5)$$

Let the q-ary conjugacy classes be defined by $\Gamma_j = \{j, jq, jq^2, \ldots, jq^{l-1}\} \bmod n$ for $j \in \{0, 1, \ldots, n-1\}$ respectively, where l is the smallest positive integer satisfying $jq^l = j$, modulo n. Due to equation (5) if $V_j=0$, then $V_i=0$ for every $i \in \Gamma_j$. For a set $W \subset \{0, 1, \ldots, n-1\}$ define $\Gamma W = \cup_{i \in W} \Gamma_i$.

An example. Before describing the general algorithm for cyclic codes, the algorithm will be examined it in the context of a simple problem, from which most of the essential insight can be derived. It is assumed that $q=2$ in this example. Let $a_i = \omega^i$, $i \in \{0, \ldots, n-1\}$. For this example, the problem considered is the problem of encoding for a code whose adjustment code (ref. (3)) has a $n\times\mu$ $F_2$ generator matrix $$G = \begin{bmatrix} (a_0)_0 & (a_0)_1 & \ldots & (a_0)_{\mu-1} \\ (a_1)_0 & (a_1)_1 & \ldots & (a_1)_{\mu-1} \\ \vdots & \vdots & \ddots & \vdots \\ (a_{n-1})_0 & (a_{n-1})_1 & \ldots & (a_{n-1})_{\mu-1} \end{bmatrix}$$

which alternately may be regarded as the transpose of the check matrix of a Hamming code. Any two rows of this matrix are linearly independent and therefore this is a code for up to two stuck bits; in this example assume that $u=2$. Recall that $\psi_0, \psi_1$ are the two distinct indices of bits that are stuck. In view of equation (4), the problem of encoding this code can be reduced to finding $c \in F_2^\mu$ such that:

$$\langle c, a_{\psi_0} \rangle = s_0, \langle c, a_{\psi_1} \rangle = s_1 \qquad (6)$$

To solve this problem, the following problem is solved first:

$$\begin{bmatrix} a_{\psi_0} & a_{\psi_0}^2 \\ a_{\psi_1} & a_{\psi_1}^2 \end{bmatrix} \begin{bmatrix} z_0 \\ z_1 \end{bmatrix} = \begin{bmatrix} w_0 \\ w_1 \end{bmatrix} \qquad (7)$$

where $z_0, z_1 \in F_{2^\mu}$ and $w_k \in F_{2^\mu}$ is given by:

$$w_k = [s_k 0 \ldots 0]^T \qquad (8)$$

for $k=0,1$. The problem described by equation (7) can be solved because the determinant of the associated matrix, which is Vandermonde, is nonzero. Next, it is shown that a solution for the problem stated in equation (6) is given by:

$$c = \Lambda z_0 + S^T \Lambda z_1 \qquad (9)$$

From equation (9), it can be deduced that:

$$\langle a_i, c \rangle = \langle a_i, \Lambda z_0 \rangle + \langle a_i, S^T \Lambda z_1 \rangle$$

$$= \langle a_i, \Lambda z_0 \rangle + \langle S a_i, \Lambda z_1 \rangle$$

$$= \langle a_i, \Lambda z_0 \rangle + \langle a_i^2, \Lambda z_1 \rangle$$

$$\stackrel{(a)}{=} (a_i z_0)_0 + (a_i^2 z_1)_0 \stackrel{(b)}{=} s_i$$

where (a) follows from Lemma A and (b) follows from equation (7); clearly an identical development may be done for the index j as well. Thus c indeed solves equation (6) and thus by extension, the encoding problem at hand.

Some general remarks which will help in elucidating generalizations of this technique follow. The first step in the solution is an embedding in a larger field (in this case, given by equation (7)). The problem in the larger field is, by design, a problem with a known efficient solution—in this case a linear system of equations involving a Vandermonde matrix. The second step in the solution is includes a collapsing of the solution in the larger field to a solution of the problem in the smaller field. This is implemented by equation (9). The right hand side in equation (7), is arbitrary as long as it satisfies $(w_i)_0 = s_i$ for $i=0,1$. Different choices for it may result in different solutions to equation (6). The Vandermonde problem solved in equation (7) is a polynomial fitting, and thus in more complex problems Lagrange's interpolation formula may be used for solving.

Figure 2:
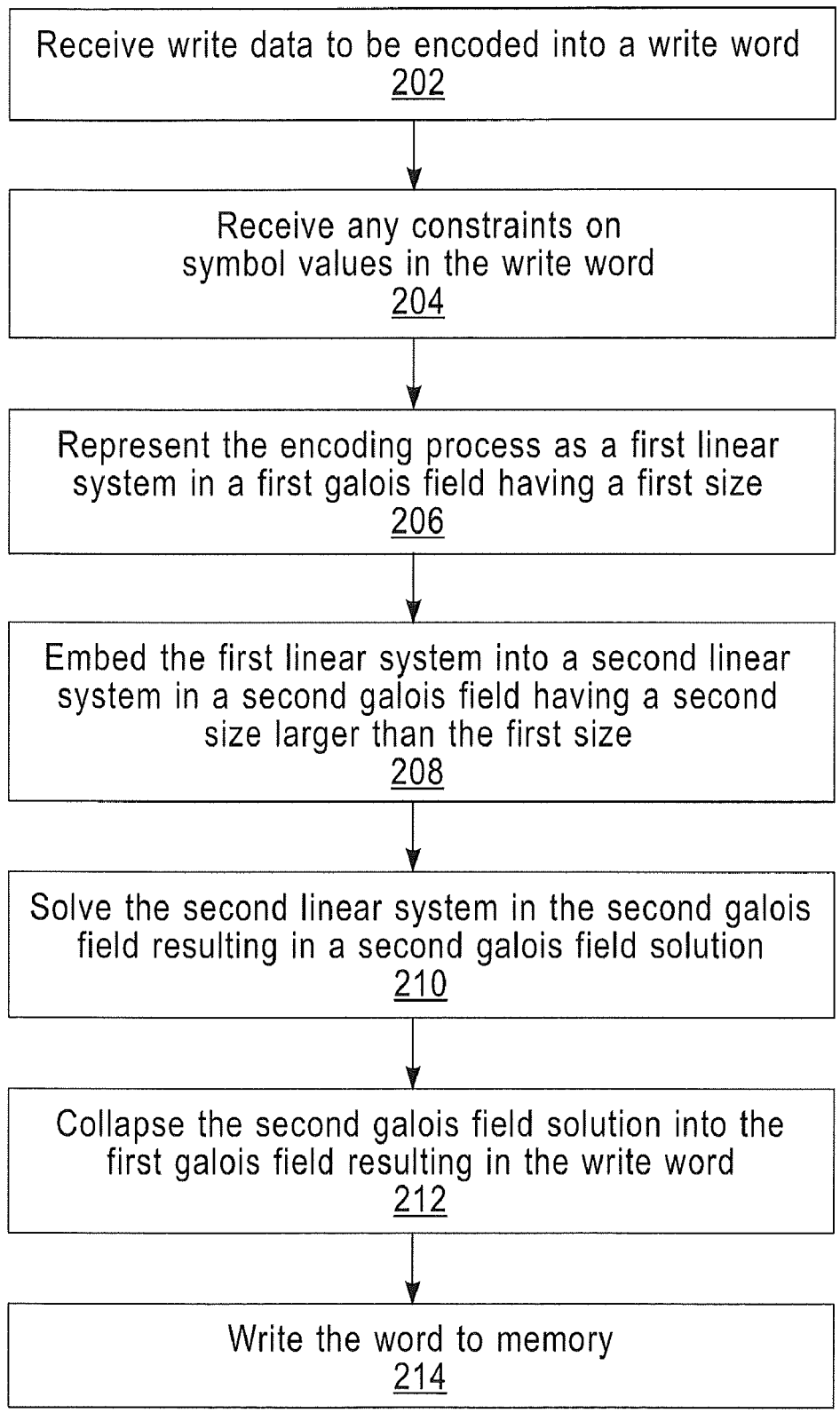
FIG. 2 illustrates a process for writing data that is implemented by an embodiment.

FIG. 2 illustrates a process for writing data that is implemented by an embodiment of the encoder 106. At block 202, write data to be encoded into a write word is received. At block 204, any constraints on symbol values in the write word are received. In an embodiment, the constraints are determined by the tester 104 depicted in FIG. 1. At block 206, the encoding process is represented as a first linear system (e.g., a first Galois field) having a first size. One way of deriving the first linear system follows.

Cyclic codes for stuck bits. In an embodiment, cyclic codes for stuck bits are obtained by using a good cyclic code (in the standard sense of minimum distance) for the dual of the adjustment code; in fact the minimum distance of such dual minus 1 is a lower bound on the number of stuck bits that can be encoded. A cyclic code for stuck bits can be defined through a frequency split. Let $W_S, W_M \subset \{0, 1, \ldots, n-1\}$ be disjoint sets such that:

$$W_S \cup W_M = \{0,1,\ldots,n-1\} \tag{10}$$

and such that $\Gamma W_S = W_S$, $\Gamma W_M = W_M$ (it can be shown that only one of these conditions is actually necessary since equation (10) will imply the other one). The frequency split is associated with the polynomials $g(\xi) = \Pi_{j \in W_M}(\xi - \omega^j), h(\xi) = \Pi_{j \in W_S}(\xi - \omega^j)$.

It is known that the coefficients of these polynomials are in $F_q$; this is due to $h(\xi)$. By definition, the adjustment code $C_A$ for this family of cyclic codes is generated by $g(\xi)$. For $H_M$, choose any parity check matrix for $C_A$.

The structure of the adjustment code. This subsection is devoted to finding a useful counterpart to equation (6) in the case of general cyclic codes. Instead of using a generator matrix for the adjustment code, a matrix will be constructed that will, in general, span only a subset of the adjustment code, and may also have redundant columns; the latter is done mostly for notational convenience. This notation M will be sued for this matrix. This construction will be most efficient when the dual of the adjustment code is a good BCH code. A generator matrix for $C_A$ can be found by identifying it with a parity check matrix for the code dual to $C_A$, which is labeled $C_A^\perp \subset F_q^n$. Since $C_A$ is generated by $g(\xi)$, it is known that $C_A^\perp$ is generated by $$h_0^{-1} \xi^{n-k} h(\xi^{-1}) = h_0^{-1} \Pi_{j \in W_S}(\xi - \omega^{-j}) \tag{11}$$

The zeros of the generator polynomial of a code can be used to construct a parity check matrix for that code. Let $n - W_S$ be the set $\{n-j : j \in W_S\}$. Since $\omega^{-j} = \omega^{n-j}$, a way of describing the code $C_A^\perp$ is through the parity check equations $C_A^\perp = \{v \in F_q^n : V_j = 0 : j \in n - W_S\}$.

Define run(•) to be the function that accepts a subset of $\{0, 1, \ldots, n-1\}$ and returns the largest run length of consecutive integers (modulo n) within that subset. It is assumed that $u = \text{run}(W_S)$. Note that $\text{run}(W_S) = \text{run}(n - W_S)$.

Let $R \subset n - W_S$ be a set with u consecutive integers, modulo n. Also let $r_0 \in \{0, \ldots, n-1\}$ be such that $R = \{r_0, r_1, \ldots, r_{u-1}\} = \{r_0, r_0+1, \ldots, r_0+u-1\} \mod n$.

Note that $\{v \in F_q^n : V_j = 0 : j \in L\} = \{v \in F_q^n : V_j = 0 : j \in R\}$ and that $C_A^\perp$ is a subset of either of these sets. Define the $n \times (L\mu)$ matrix M with entries in $F_q$ by $$[M]_{m,i\mu+j} = (\omega^{ml_i})^j \tag{12}$$

for $m \in \{0, \ldots, n-1\}$, $i \in \{0, \ldots, L-1\}$, $j \in \{0, \ldots, \mu-1\}$. It is noted that M will in general have redundant columns. Therefore $\{v \in F_q^n : V_j = 0, j \in L\} = \{v \in F_q^n : M^T v = 0\}$.

By construction: $\{v \in F_q^n : v = M\xi \text{ for some } \xi \in F_q^{\mu L}\} \subset C_A$.

The set of adjustment codewords are employed in the left to perform the encoding task.

At block 208 in FIG. 2, the first linear system is embedded into a second linear system (e.g., a second Galois field) having a second size larger than the first size. At block 210, the second linear system is solved, resulting in a second field solution. An embodiment of how blocks 208 and 210 are performed follows.

Embedding. The first step of the encoding algorithm is the embedding in a recognizable computational problem in a larger field, in this case given by a Vandermonde system of equations. The system of equations to be solved is $$B \begin{bmatrix} z_0 \\ \vdots \\ z_{u-1} \end{bmatrix} = \begin{bmatrix} w_0 \\ \vdots \\ w_{u-1} \end{bmatrix} \tag{13}$$

$$B \begin{bmatrix} w^{r_0 \psi_0} & \cdots & w^{(r_0+u-1)\psi_0} \\ \vdots & \ddots & \vdots \\ w^{r_0 \psi_{u-1}} & \cdots & w^{(r_0+u-1)\psi_{u-1}} \end{bmatrix} \tag{14}$$

$$w_k = [s_k \ 0 \ \cdots \ 0]^T \tag{15}$$

for $k \in \{0, \ldots, u-1\}$. This is not exactly a Vandermonde system but since B can be written as the product of a diagonal invertible matrix times a Vandermonde matrix, it is referred to herein as the Vandermonde problem. A $u \times u$ Vandermonde matrix has an inverse that can be written analytically involving no more than $O(u^2)$ operations in $F_{q^u}$, and thus the system of equations can be solved within the same complexity. Note that strictly speaking, the basic problem is polynomial fitting problem that may be solved using any available algorithm with desired computational advantages.

At block 212 in FIG. 2, the second field solution is collapsed into the first field, resulting in the write word. At block 214, the write word is written to memory. It is assumed the existence of a solution $\{z_0, \ldots, z_{u-1}\}$ satisfying equation (13). The goal is to build a $\xi \in F_q^{\mu L}$ such that $[M\xi]_{\psi_k} = s_k$, $k \in \{0, \ldots, u-1\}$. Let $\tau: \{0, \ldots, L-1\} \times \{0, \ldots, \mu-1\} \to \{0, \ldots, u-1\}$ be the mapping such that $r_{\tau(i,j)} = q^{\kappa(i,j)} l_i \mod n$. Them for $k \in \{0, \ldots, u-1\}$:

$$\sum_{j=0}^{u-1} z_j \omega^{(r_0+j)\psi_k} = \sum_{i=0}^{|L|-1} \sum_{j=0}^{|P_i|-1} z_{\tau(i,j)} \omega^{l_i q^{\kappa(i,j)} \psi_k} \tag{16}$$

A method for collapsing according to an embodiment follows.

Theorem 1. Let, for $i \in \{0, \ldots, |L|-1\}$ $$c_i = \sum_{j=0}^{|P_i|-1} (S^{\kappa(i,j)})^T \Lambda z_{\tau(i,j)} \quad (17)$$

and define $\xi_{i\mu+j} = (c_i)_j$ for $i \in \{0, \ldots, |L|-1\}$, $j \in \{0, \ldots, \mu-1\}$
Then for $k \in \{0, \ldots, u-1\}$, $[M\xi]_{\psi_k} = s_k$.

Proof of Theorem 1. The proof is a generalization of the ideas in the above example. The quantity $(M\xi)_k$ can be rewritten as:

$$\sum_{i=0}^{|L|-1} \langle c_i, \omega^{l_i \psi_k} \rangle = \sum_{i=0}^{|L|-1} \left\langle \sum_{j=0}^{|P_i|-1} (S^{\kappa(i,j)})^T \Lambda z_{\tau(i,j)}, \omega^{l_i \psi_k} \right\rangle$$

$$= \sum_{i=0}^{|L|-1} \sum_{j=0}^{|P_i|-1} \left\langle (S^{\kappa(i,j)})^T \Lambda z_{\tau(i,j)}, \omega^{l_i \psi_k} \right\rangle$$

$$= \sum_{i=0}^{|L|-1} \sum_{j=0}^{|P_i|-1} \left\langle \Lambda z_{\tau(i,j)}, S^{\kappa(i,j)} \omega^{l_i \psi_k} \right\rangle$$

$$\stackrel{(a)}{=} \sum_{i=0}^{|L|-1} \sum_{j=0}^{|P_i|-1} \left\langle \Lambda z_{\tau(i,j)}, \omega^{l_i q^{\kappa(i,j)} \psi_k} \right\rangle$$

$$\stackrel{(b)}{=} \sum_{i=0}^{|L|-1} \sum_{j=0}^{|P_i|-1} \left( z_{\tau(i,j)} \omega^{l_i q^{\kappa(i,j)} \psi_k} \right)_0 = \left( \sum_{i=0}^{|L|-1} \sum_{j=0}^{|P_i|-1} z_{\tau(i,j)} \omega^{l_i q^{\kappa(i,j)} \psi_k} \right)_0$$

$$\stackrel{(c)}{=} \left( \sum_{j=0}^{u-1} z_j \omega^{(r_0 + j)\psi_k} \right)_0 \stackrel{(d)}{=} s_k$$

where (a) follows from the fact that $S\xi = \xi^q$, (b) follows from Lemma A, (c) follows from equation (16) and (d) follows from equations (13 and 15)

In order to do an asymptotic computational complexity analysis, it is necessary to specify how the problem at hand will be scaled. A natural parameter to scale is $\mu$, which dictates the codeword length via the relation $\log_q(n+1) = \mu$. As one scales $\mu$ (and hence n), the number of stuck symbols u to be encoded should also be scaled.

Following is a comparison of the computational complexity of the proposed algorithm described herein when compared with standard Gaussian elimination. As every $F_{q^\mu}$ operation can be implemented in $O(\mu^2)$ $F_q$ operations, the suggested algorithm has complexity $O(u^2 \mu^2)$ $F_q$ operations. On the other hand, Gaussian elimination solves the problem using $\Omega(u^3)$ $F_q$ operations (in reality the complexity is in general bigger than this, but a lower bound suffices for our comparison).

As long as u grows faster than $\mu^2$ ($u/\mu^2 \to \infty$), the encoding algorithm presented herein will outperform Gaussian elimination. It is important to note that the class of codes considered in this article do not possess asymptotics that allow u to grow linearly with n, for the same reason that BCH codes, as a family, have a best case "zero" asymptotic coding rate. Thus, it is important to analyze how fast can one, in principle, have u grow as a function of $\mu$. The concern is addressed using an approximate analysis in order to preserve the readability of the text. Using a rather loose bound, every stuck symbol costs at most $\mu$ symbols worth of redundancy. Now, let $\alpha \in (0,1)$ be a parameter that we will keep constant as we scale the problem. After investing $\lfloor \alpha n/\mu \rfloor$ redundant symbols it is possible to encode with at least $$u \geq \left\lfloor \alpha \frac{n}{\mu} \right\rfloor \approx \alpha \frac{q^\mu}{\mu}$$

stuck symbols. Under this scaling law, it can be seen that u can grow significantly faster than $\mu^2$. Thus, this analysis concludes that the algorithm presented in here outperforms Gaussian elimination in a large set of circumstances.

Figure 3:
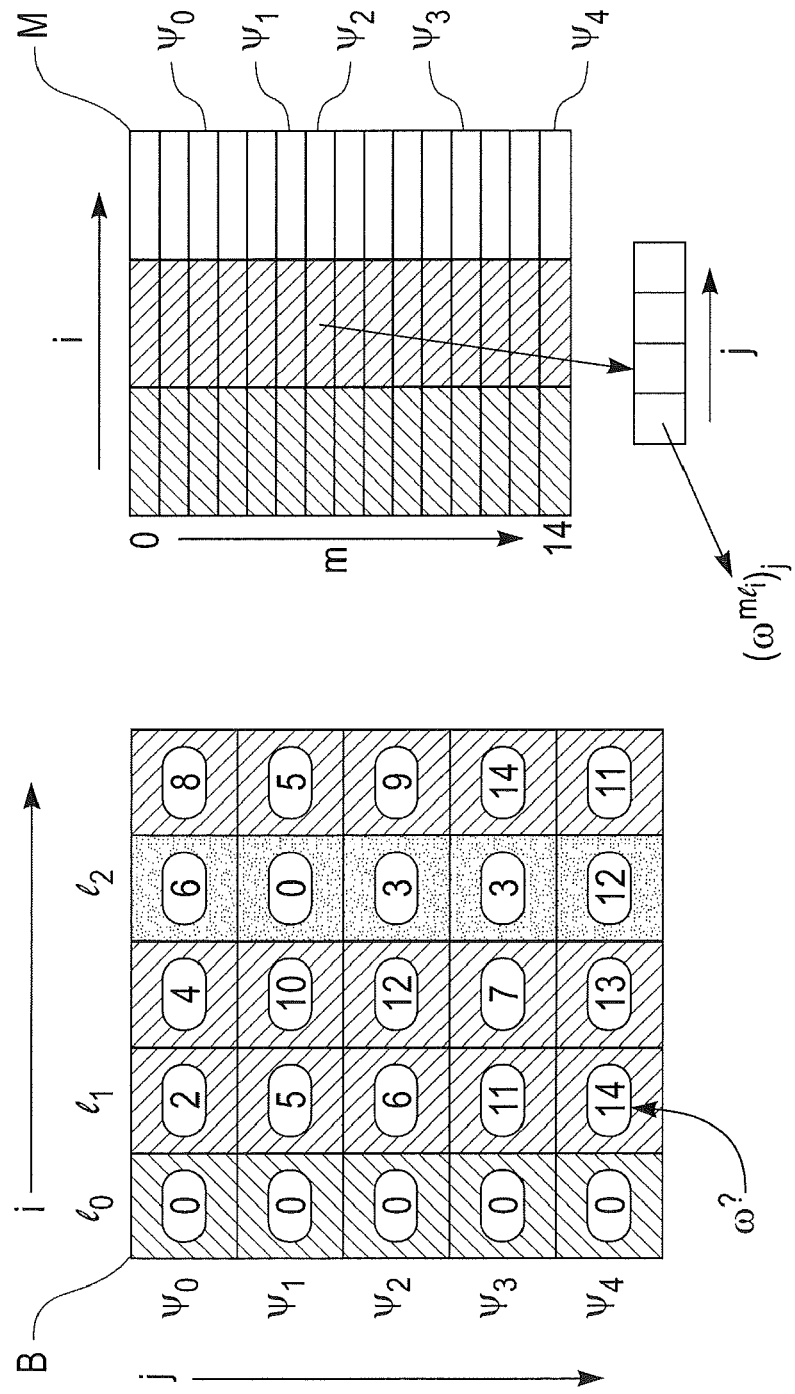
FIG. 3 illustrates an example of the relationship between matrices that are utilized by an embodiment.

FIG. 3 illustrates an example of the relation between the embedding B and the matrix M as described above in reference to blocks 206, 208 and 210 in FIG. 2. The example in FIG. 3 depicts a code for 15 bit write words, 5 constrained bits (or stuck bits), and 6 data bits. The example parameters are $q=2$, $\mu=4$, $n=15$, $k=6$, $u=5$, $l_0=0$, $l_1=1$, $l_2=3$, $P_0=\{0\}$, $P_1=\{1, 2,4\}$, $P_2=\{3\}$, $R=\{0,1,2,3,4\}$, $L=\{0,1,3\}$, $W_S=\{0,11,12,13, 14\}$, $W_M=\{1,2,3,4,5,6,7,8,9,10\}$, $\psi_0=2$, $\psi_1=5$, $\psi_2=6$, $\psi_3=11$, $\psi_4=14$, $\Gamma_0=\{0\}$, $\Gamma_1=\{1,2,4,8\}$, $\Gamma_3=\{3,6,9,12\}$, $\Gamma_5=\{5,10\}$, $\Gamma_7=\{7,11,13,14\}$. The matrix M has 12 columns but three of them (1,2,3) are redundant since each of their entries is zero. If the redundant columns are eliminated, generator matrix for the adjustment code is obtained. M is shown with rectangles on quarter of the width of B because during a matrix multiplication, a $F_{2^4}$ element can be thought of as a 4×4 operator with entries in $F_2$. The powers of $\omega$ in the matrix B for this example are shown explicitly.

Figure 4:
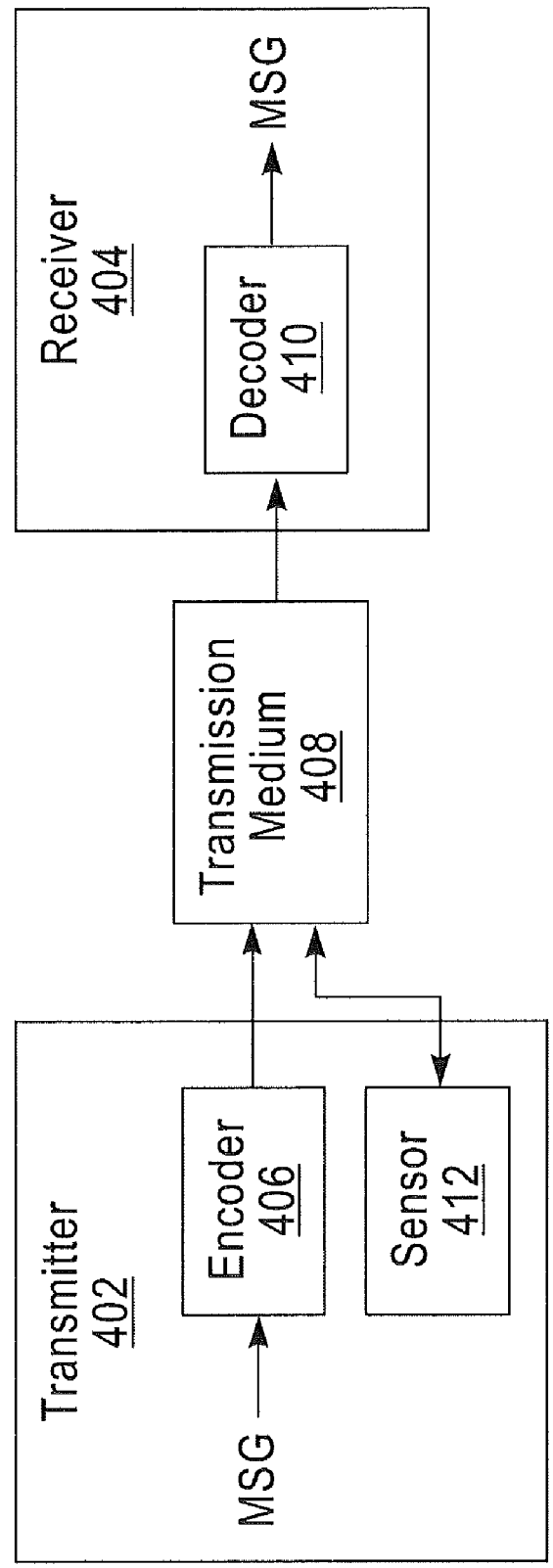
FIG. 4 illustrates a block diagram of a system for encoding and decoding transmitted data in accordance with an embodiment.

FIG. 4 illustrates a block diagram of a system for encoding and decoding transmitted data in accordance with an embodiment. The system depicted in FIG. 1 includes a transmission medium made up of links (e.g., physical wires, optical fibres, wireless connections, etc.) for transmitting a message between a transmitter 402 and a receiver 404. As shown in FIG. 4, the transmitter includes a sensor 412 for links in the transmission medium 408 that require a constrained value (e.g., a "stuck bit") and an encoder 406 for performing the encoding described herein in response to the required constrained values. The receiver 404 includes a decoder 410 for decoding the encoded message. In an embodiment, the decoder 410 does not need to know about the constrained values required by the transmission medium 408 and instead may decide on its own how to constrain the values.

Figure 5:
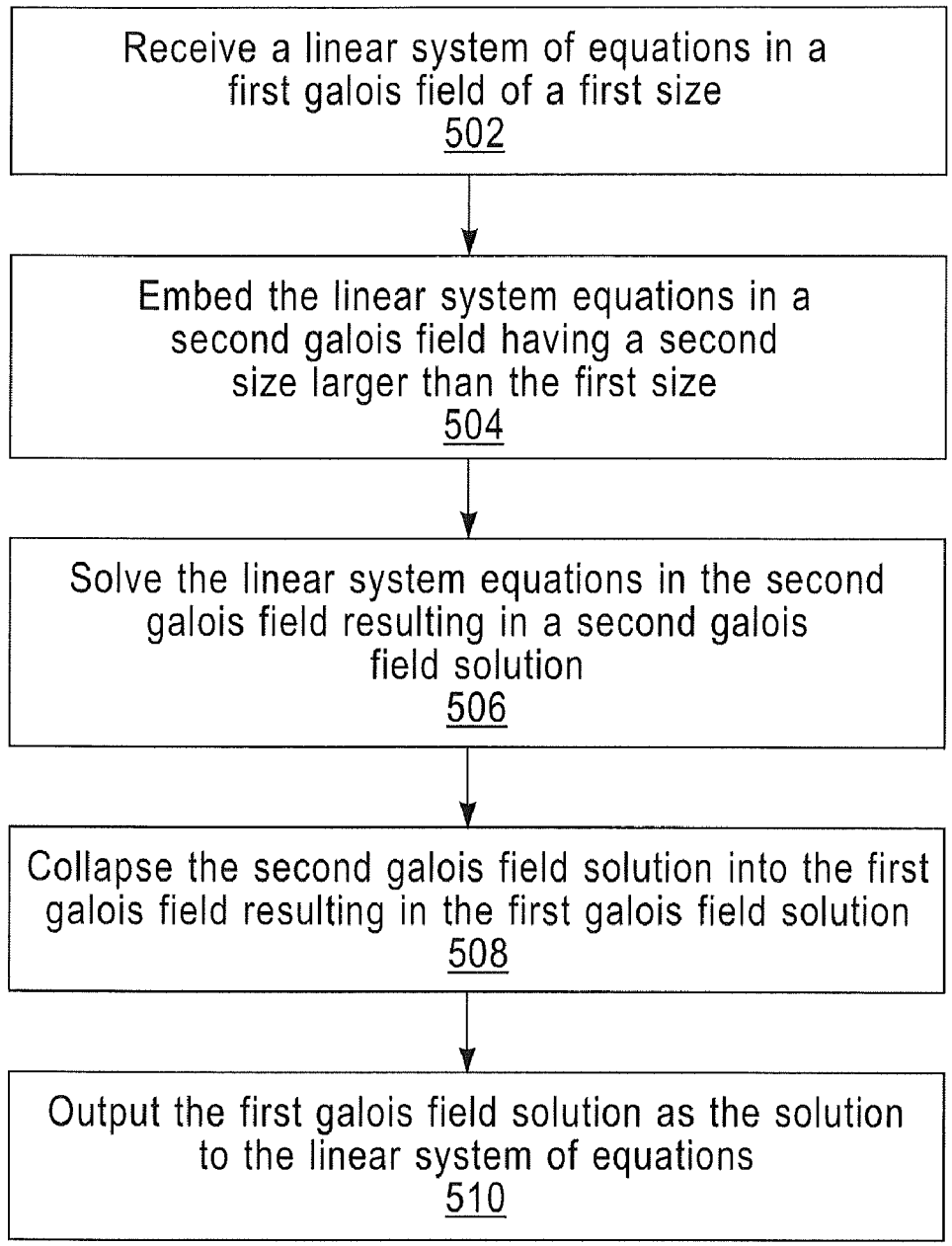
FIG. 5 illustrates a process for solving a linear system of equations that is implemented by an embodiment.

FIG. 5 illustrates a process for solving a linear system of equations that is implemented by an embodiment. At block 502, a linear system of equations is received in a first field (e.g., a Galois field) having a first size. At block 504, the linear system of equations is embedded in a linear system of equations in a second field (e.g., a Galois field) that is larger than the size of the first field. In an embodiment, the linear system of equations in the second field is an underspecified system of equations (i.e., more unknowns than equations). The linear system of equations is solved in the second field at block 506. At block 508, the solution in the second field is collapsed into the first field to generate a solution to the linear system of equations received at block 502. At block 510, the solution is output.

Technical effects and benefits include the ability to store more data in memory (higher density) by utilizes memory cells or symbols having constrained values.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer implemented method for writing data, the method comprising:
    receiving write data to be encoded into a write word;
    receiving constraints on symbol values associated with the write word;
    encoding the write data into the write word, the encoding comprising:
        representing the write data and the constraints as a first linear system in a first field of a first size;
        embedding the first linear system into a second linear system in a second field of a second size, the second size larger than the first size;
        solving the second linear system in the second field resulting in a solution; and
        collapsing the solution into the first field resulting in the write word, the write word satisfying the constraints on symbol values associated with the write word; and
    writing the write word to a memory.

2. The method of claim 1, wherein the first and second fields are Galois fields.

3. The method of claim 1, wherein the memory is a phase change memory (PCM).

4. The method of claim 1, wherein the constraints are due to physical defects in the memory.

5. The method of claim 1, wherein the second linear system is represented as Vandermonde matrix.

6. The method of claim 5, wherein the Vandermonde matrix contains powers of symbols denoting locations of constrained symbol values.

7. The method of claim 1, wherein the first linear system includes an underspecified system of equations.

8. The method of claim 1, wherein the collapsing includes multiplying a matrix times the solution.

9. The method of claim 1 wherein the collapsing the solution includes multiplying a matrix times the solution and adding it to a result of multiplying a different matrix times the write data.

10. A memory system comprising:
    a memory including memory cells and constraints on symbol values stored in the memory cells; and
    an encoder in communication with the memory, the encoder configured for:
        receiving write data to be encoded into a write word that satisfies the constraints on the symbol values;
        encoding the write data into the write word, the encoding comprising:
            representing the write data and the constraints as a first linear system in a first field of a first size;
            embedding the first linear system into a second linear system in a second field of a second size, the second size larger than the first size;
            solving the second linear system in the second field resulting in a solution; and
            collapsing the solution into the first field resulting in the write word, the write word satisfying the constraints on symbol values in the write word; and
        transmitting the write word to the memory.

11. The system of claim 10, wherein the first and second fields are Galois fields.

12. The system of claim 10, wherein the memory is a phase change memory (PCM).

13. The system of claim 10, wherein the constraints are constrained values.

14. The system of claim 10, wherein the second linear system is represented as Vandermonde matrix.

15. The system of claim 10, wherein the first linear system includes an underspecified system of equations.

16. The system of claim 10, wherein the collapsing includes multiplying a matrix times the solution.

17. A computer implemented method for transmitting data, the method comprising:
    receiving data to be encoded into a word for transmission across a transmission medium;
    receiving constraints on symbol values associated with the word;
    encoding the data into the word, the encoding comprising:
        representing the data and the constraints as a first linear system in a first field of a first size;
        embedding the first linear system into a second linear system in a second field of a second size, the second size larger than the first size;
        solving the second linear system in the second field resulting in a solution; and
        collapsing the solution into the first field resulting in the word, the word satisfying the constraints on symbol values associated with the word; and
    outputting the word on the transmission medium.

18. The method of claim 17, wherein the first and second fields are Galois fields.

19. The method of claim 17, wherein the constraints are constrained values.

20. The method of claim 17, wherein the first linear system is represented as Vandermonde matrix.

21. The method of claim 17, wherein the second linear system includes an underspecified system of equations.

22. The method of claim 17, wherein the collapsing includes multiplying a matrix times the solution.

23. A computer implemented method for solving linear systems, the method comprising:
    receiving a linear system of equations in a first field of a first size;
    embedding the linear system of equations into a second field of a second size, the second size larger than the first size;
    solving the linear system of equations in the second field resulting in a second field solution; and
    collapsing the second field solution into the first field resulting in a first field solution; and
    outputting the first field solution.

24. The method of claim 23, wherein the first and second fields are Galois fields.

25. The method of claim 23 wherein the constraints are constrained values.

* * * * *